(12) United States Patent
Kobayashi et al.

(10) Patent No.: US 10,099,476 B2
(45) Date of Patent: Oct. 16, 2018

(54) PIEZOELECTRIC THIN FILM, METHOD OF MANUFACTURING THE SAME, PIEZOELECTRIC THIN FILM MANUFACTURING APPARATUS AND LIQUID EJECTION HEAD

(71) Applicant: CANON KABUSHIKI KAISHA, Tokyo (JP)

(72) Inventors: Motokazu Kobayashi, Yokohama (JP); Yoshinori Kotani, Yokohama (JP); Naoyuki Koketsu, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/230,969

(22) Filed: Aug. 8, 2016

(65) Prior Publication Data

US 2016/0339702 A1    Nov. 24, 2016

Related U.S. Application Data

(62) Division of application No. 14/549,839, filed on Nov. 21, 2014, now Pat. No. 9,437,806.

(30) Foreign Application Priority Data

Dec. 2, 2013    (JP) .................................. 2013-249324

(51) Int. Cl.
*B41J 2/045* (2006.01)
*B41J 2/14* (2006.01)
(Continued)

(52) U.S. Cl.
CPC .......... *B41J 2/14233* (2013.01); *B41J 2/161* (2013.01); *B41J 2/164* (2013.01); *B41J 2/1642* (2013.01);
(Continued)

(58) Field of Classification Search
None
See application file for complete search history.

(56) References Cited

U.S. PATENT DOCUMENTS 6,097,133 A    8/2000    Shimada et al.
6,294,860 B1    9/2001    Shimada et al.
(Continued)

FOREIGN PATENT DOCUMENTS

JP    2007-019111 A    1/2007
JP    3890634 B2    3/2007
(Continued)

OTHER PUBLICATIONS

Notification of Reasons for Refusal in Japanese Application No. 2014-243366 (dated Aug. 21, 2018).

*Primary Examiner* — Erica Lin

(74) *Attorney, Agent, or Firm* — Fitzpatrick, Cella, Harper & Scinto

(57) ABSTRACT

A piezoelectric thin film is manufactured by sequentially executing: a step of coating a substrate by applying a coating solution containing an organic solvent and a piezoelectric thin film precursor to form a coating layer; a step of evaporating the organic solvent from the coating layer in a windless environment to obtain a dried coating layer containing the piezoelectric thin film precursor; and a step of heating the dried coating layer to form a piezoelectric thin film from the dried coating layer containing the piezoelectric thin film precursor.

2 Claims, 5 Drawing Sheets

(51) Int. Cl.
    *H01L 41/08*     (2006.01)
    *B41J 2/16*     (2006.01)
    *H01L 41/187*     (2006.01)
    *H01L 41/317*     (2013.01)
    *H01L 41/314*     (2013.01)
    *H01L 41/09*     (2006.01)

(52) U.S. Cl.
    CPC ........ *B41J 2/1646* (2013.01); *H01L 41/0805* (2013.01); *H01L 41/1876* (2013.01); *H01L 41/314* (2013.01); *H01L 41/317* (2013.01); *B41J 2002/1425* (2013.01); *H01L 41/0973* (2013.01)

(56) References Cited

U.S. PATENT DOCUMENTS

| | | | |
|---|---|---|---|
| 6,387,225 | B1 | 5/2002 | Shimada et al. |
| 7,921,801 | B2 | 4/2011 | Ishihara et al. |
| 8,956,689 | B2 | 2/2015 | Watanabe et al. |
| 2004/0013794 | A1 | 1/2004 | Hashimoto et al. |
| 2006/0170736 | A1* | 8/2006 | Tomozawa ........... B41J 2/14233 347/71 |
| 2006/0232639 | A1* | 10/2006 | Sumi ................... B41J 2/14233 347/68 |
| 2009/0219348 | A1* | 9/2009 | Miyazawa ........... B41J 2/14233 347/70 |
| 2010/0147681 | A1 | 6/2010 | Li et al. |
| 2010/0208005 | A1 | 8/2010 | Fujii et al. |
| 2011/0207328 | A1 | 8/2011 | Speakman |
| 2013/0148205 | A1 | 6/2013 | Kobayashi et al. |
| 2015/0187569 | A1 | 7/2015 | Watanabe et al. |

FOREIGN PATENT DOCUMENTS

| | | |
|---|---|---|
| JP | 2007-253043 A | 10/2007 |
| JP | 2012-256850 A | 12/2012 |

* cited by examiner

PIEZOELECTRIC THIN FILM, METHOD OF MANUFACTURING THE SAME, PIEZOELECTRIC THIN FILM MANUFACTURING APPARATUS AND LIQUID EJECTION HEAD

CROSS-REFERENCE TO RELATED APPLICATIONS

This application is a divisional application of U.S. patent application Ser. No. 14/549,839, filed Nov. 21, 2014, which claims the benefit of Japanese Patent Application No. 2013-249324, filed Dec. 2, 2013. All prior applications are hereby incorporated by reference herein in their entirety.

BACKGROUND OF THE INVENTION

Field of the Invention

The present invention relates to a piezoelectric thin film, a method of manufacturing the same, a piezoelectric thin film manufacturing apparatus and a liquid ejection head.

Description of the Related Art

Application examples of piezoelectric devices realized by using piezoelectric thin film include liquid ejection heads for ejecting liquid such as ink. For a piezoelectric thin film to be used for such an application to make its electromechanical transduction feature (of displacement urging pressure) satisfactorily functional, the film preferably has a film thickness not less than 1 μm and not more than 25 μm according to generally accepted theories. Additionally, uniformity is desired to the film for the purpose of accurately controlling displacements.

Known methods of manufacturing piezoelectric thin films include the sputtering method, the metal organic chemical vapor deposition (MDCVD) method and the sol-gel method. With a sol-gel process, firstly a coating solution containing a hydrolizable compound of each of the component metals that operate as starting materials, a partially hydrolyzed compound thereof or a partially poly-condensated compound thereof (piezoelectric thin film precursor) is applied to a substrate and the layer consisting of the coating solution is dried. Subsequently, the dried layer is heated in air and baked at a temperature not lower than the crystallization temperature of the piezoelectric thin film precursor to crystalize the precursor and produce a piezoelectric thin film. Lead zirconate titanate (to be referred to as "PZT hereinafter"), a material formed by adding lanthanum to PZT as the third component, which is referred to as "PLZT type" material, or the like is normally employed as the material of piezoelectric thin film. A sol-gel process as described above can form a piezoelectric thin film least costly and most easily.

A metal organic deposition (MOD) process is also known. This process is similar to a sol-gel process. With an MOD process, a coating solution containing a pyrolytic organic metal compound (metal complexes and organic acid salts of metals), for example β-diketone complex of a metal or a metal carboxylate, is applied to a substrate. Then, the applied coating solution is dried in air or in oxygen, for example, to evaporate the solvent in the coating solution and to pyrolize the organic metal compound. Additionally, the piezoelectric thin film precursor is baked at a temperature not lower than the crystallization temperature thereof to crystalize the precursor and produces a piezoelectric thin film.

In this specification document, the sol-gel method, the MOD method and the method realized by combining them are collectively referred to as "the sol-gel method".

As for the crystalline orientation of a piezoelectric thin film of PZT or the like that is formed by means of the sol-gel method, the direction of polarization moment comes closer to the direction of deformation of the piezoelectric body as the orientation ratio of (100) plane rises relative to the orientation ratio of the other planes ((111) plane, (110) plane, etc.). Therefore, a piezoelectric thin film that represents a high orientation ratio for (100) plane represents deformation to a large extent so that such as piezoelectric thin film can suitably be used as actuator for a liquid ejection head. (See the specification of Japanese Patent No. 3,890,634.)

A piezoelectric thin film formed by using PZT that is produced by way of a sol-gel process is generally arranged on a silicon substrate, a metal substrate, a ceramic substrate or the like (to be referred to simply as "substrate" hereinafter), on which an electrode of platinum or the like has been formed, and then used as piezoelectric device. Substrates as listed above have increasingly been upsized in recent years. In other words, the size of such substrates has been shifted from 4-inch to 6-inch and further to 8-inch. If substrates are upsized, preferably, the orientation ratio of (100) plane is made higher than the orientation ratio of (111) plane and (110) plane and the orientation ratio of (100) plane is practically uniform and invariable throughout the piezoelectric thin film.

However, as substrates are upsized to increase the surface areas of substrates, there arises a tendency that the orientation ratio of (100) plane falls and become remarkably variable from spot to spot in the substrate. Then, as a result, there arises a problem that the electric characteristics of the substrate become variable within the substrate.

SUMMARY OF THE INVENTION

According to the present invention, the above-identified problems are dissolved by providing a piezoelectric thin film manufacturing method including: a step of coating a substrate by applying a coating solution containing an organic solvent and a piezoelectric thin film precursor to form a coating layer; a step of evaporating the organic solvent from the coating layer in a windless environment to obtain a dried coating layer containing the piezoelectric thin film precursor; and a step of heating the dried coating layer to form a piezoelectric thin film from the dried coating layer containing the piezoelectric thin film precursor.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Now, the present invention will be described in greater detail below by way of embodiments of the invention. Note, however, the present invention is by no means limited by those embodiments.

1. Piezoelectric Thin Film

Figure 1:
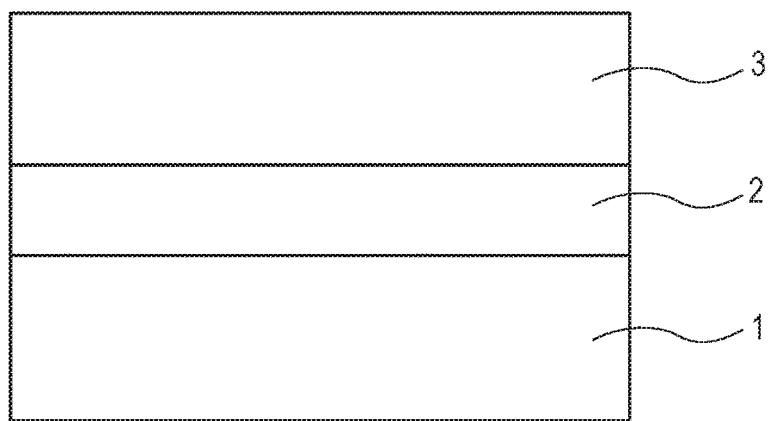
FIG. 1 is a schematic longitudinal sectional view of an embodiment of piezoelectric thin film according to the present invention.

FIG. 1 is a schematic longitudinal cross sectional view of an embodiment of piezoelectric thin film according to the present invention. In FIG. 1, 1 denotes a substrate that supports a piezoelectric thin film and 2 denotes an electrode, while 3 denotes a piezoelectric thin film. While the material of the substrate 1 is not subjected to any particular limitations, the substrate is preferably made of a material that suppresses deformations and melt of a dried coating layer in a heating step, which will be described in greater detail hereinafter. When a piezoelectric thin film that is obtained as this embodiment is employed to manufacture a liquid ejection head for ejecting liquid such as ink, the substrate 1 may be made to also operate as pressure chamber substrate for forming pressure chambers therein. For the above-described purpose, for example, a semiconductor substrate made of silicon (Si) or tungsten (W) or the like, or a heat-resistant stainless steel (SUS) substrate may preferably be employed, although a ceramic substrate made of zirconia, alumina or silica may also be employed. A plurality of materials selected from the above-listed materials may be combined or a multilayer structure may be realized by laying a plurality of layers of different materials to form such a substrate.

The electrode 2 is formed as an electro-conductive layer having a thickness of not less than 5 nm and not more than 2,000 nm. While the material of the electrode 2 is not subjected to any particular limitations, and the material may be any materials which are commonly used to form a piezoelectric device, examples of materials that can be used for the electrode 2 include metals such as Ti, Pt, Ta, Ir, Sr, In, Sn, Au, Al, Fe, Cr, Ni, or the like, and oxides of such metals. The electrode 2 may be made of a single one of the above-listed materials or formed by arranging layers of two or more than two materials selected from the above-listed materials. The selected one or more than one metals and/or one or more than one oxides of the metals may be applied by way of a sol-gel process and baked in order to produce an electrode. A sputtering process or a vapor deposition process may alternatively be employed. Still alternatively, the electrode 2 may be formed to represent a desired profile by patterning.

While no limitations are imposed on materials that can be used for the piezoelectric thin film 3, the use of perovskite type crystal expressed by general formula $Pb_{(1.00\sim1.20)}(Zr_xTi_{1-x})O_3$, (where x=0.4 to 0.6) is preferable. Perovskite type crystal that provides a high piezoelectric effect can be obtained when the compositional ratio of Zr and that of Ti are found within the above-described respective ranges.

The piezoelectric thin film 3 may be doped with one or more than one elements other than Pb, Zr and Ti to a very small ratio. Examples of elements that can be used as dopant for this embodiment include La, Ca, Sr, Ba, Sn, Th, Y, Sm, Ce, Bi, Sb, Nb, Ta, W, Mo, Cr, Co, Ni, Fe, Cu, Si, Ge, Sc, Mg, Mn, or the like. The piezoelectric thin film 3 can be doped with any of the above-listed elements by adding a compound containing the element, or elements, at the time of preparing the coating solution. The ratio by which the dopant is or dopants are added is preferably between 0.1 mass % and 2 mass % of $Pb_{(1.00\sim1.20)}(Zr_xTi_{1-x})O_3$, (where x=0.4 to 0.6).

Figure 6:
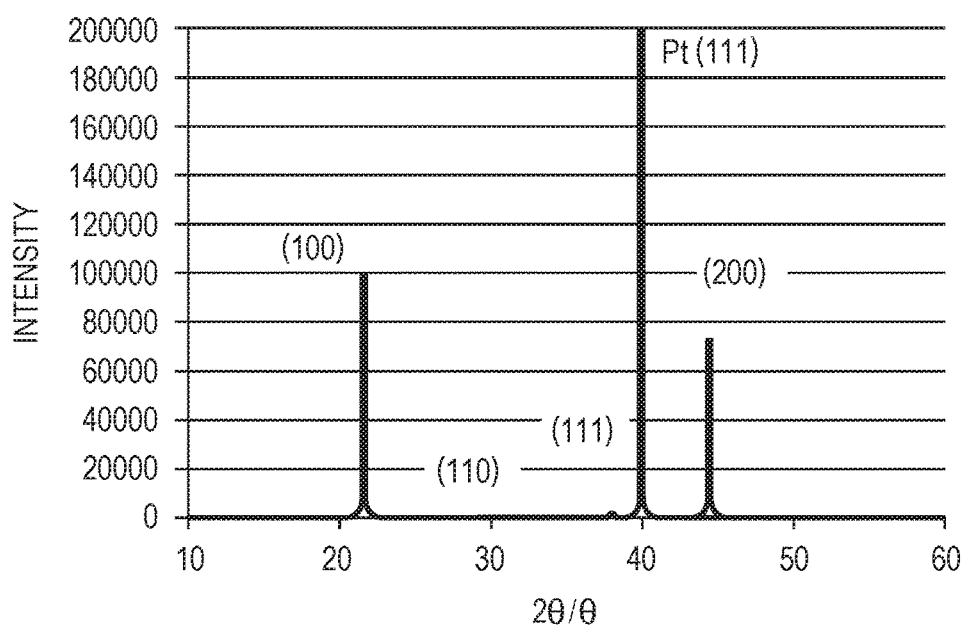
FIG. 6 is a schematic illustration of the X-ray diffraction pattern at a measurement position on the substrate of Example 1.

Now, a method of evaluating the orientation of (100) plane of a piezoelectric thin film will be described below. The state of orientation of (100) plane of a piezoelectric thin film can easily be confirmed from the detection angles and the intensities of the diffraction peaks in an X-ray diffraction measurement by means of $2\theta/\theta$ method using a wavelength of Cu K$\alpha$ line. For example, in the diffraction chart obtained from the piezoelectric thin film of this embodiment as illustrated in FIG. 6, the peak intensity of (100) plane is found near 22° and the peak intensity of (110) plane is found near 31°, while the peak intensity of (111) plane is found near 38°. The ratio of the intensity of (100) plane can be determined by dividing the peak intensity of (100) plane by the sum of the peak intensities of (100) plane, (110) plane and (111) plane.

An excellent piezoelectric effect can be achieved when the ratio of the intensity of (100) plane relative to the sum of the peak intensities of (100) plane, (110) Plane and (111) plane is not less than 95% at any part of the substrate. Additionally and preferably, the main surface of the substrate is preferably in parallel with (100) plane of the piezoelectric thin film.

2. Liquid Ejection Head

Figure 7:
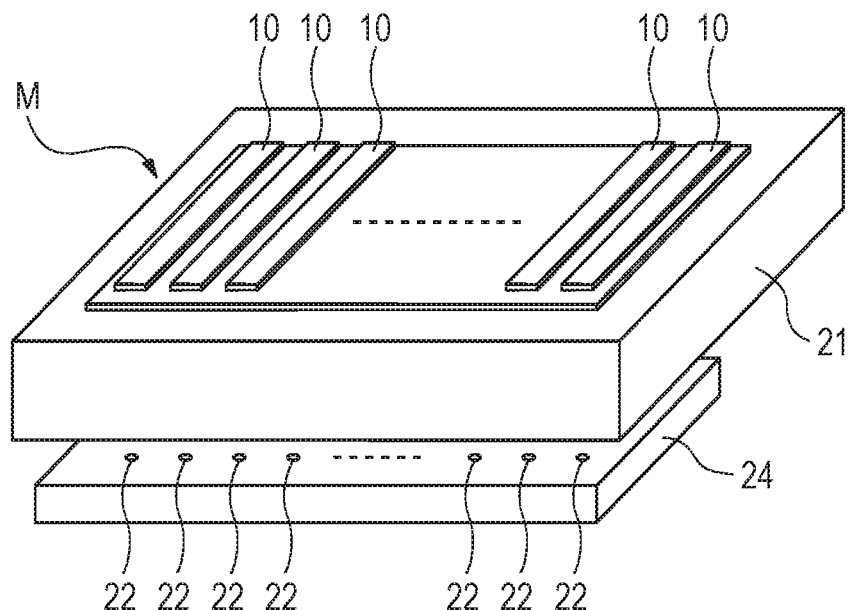
FIG. 7 is a schematic illustration of an embodiment of liquid ejection head according to the present invention.
Figure 8:
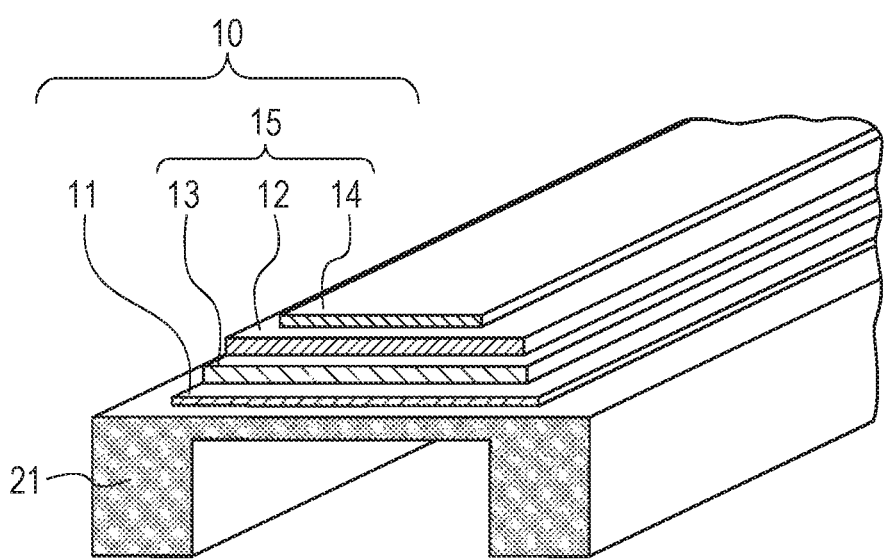
FIG. 8 is a schematic illustration of a part of an embodiment of liquid ejection head according to the present invention, illustrating the positional relationship between one of the pressure chambers of the liquid ejection head and the corresponding one of the piezoelectric actuators.
Figure 9:
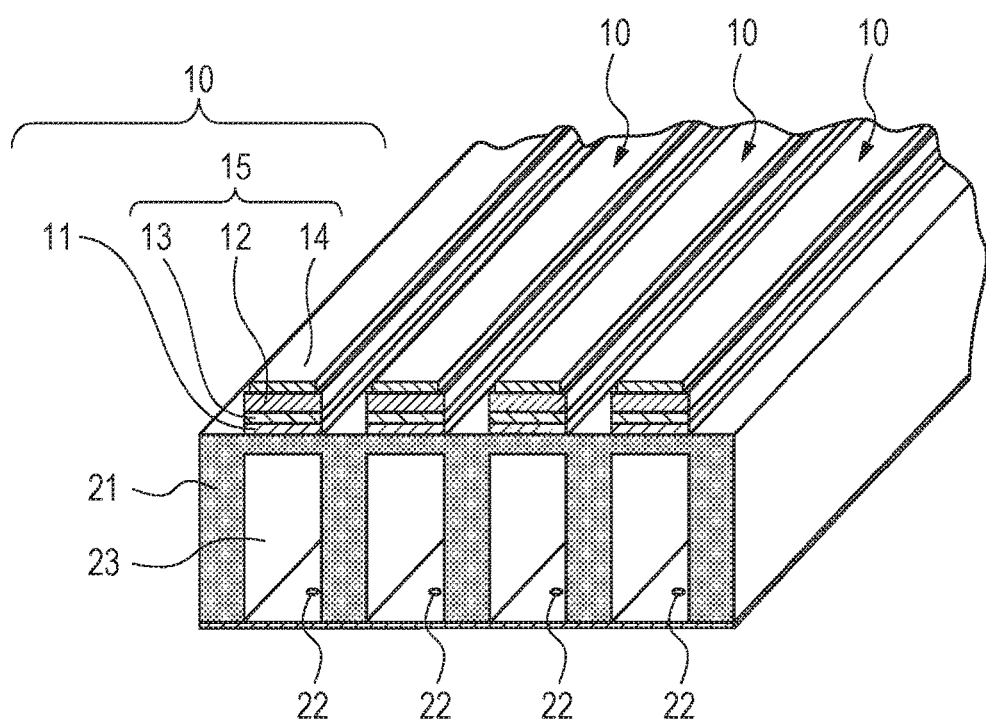
FIG. 9 is a schematic illustration of a part of an embodiment of liquid ejection head according to the present invention, illustrating the position relationship of the pressure chambers of the liquid ejection head, the piezoelectric actuators and the ink ejection ports.

FIGS. 7 through 9 schematically illustrate an embodiment of liquid ejection head according to the present invention that is provided with a piezoelectric thin film prepared by way of the above-described process. The liquid ejection head M includes a liquid ejection head substrate 21, a plurality of ink ejection ports 22, a plurality of pressure chambers 23 and actuators 10 arranged at positions that correspond to the respective pressure chambers 23. The pressure chambers 23 are arranged so as to correspond to the respective ink ejection ports 22 and held in communication with the respective ink ejection ports 22. Each of the pressure chambers 23 is adapted to change its volume and eject ink from its ink ejection port 22 as the corresponding one of the actuators 10 vibrates. The ink ejection ports 22 are formed in a nozzle plate 24 and arranged at predetermined intervals, while the pressure chambers 23 are arranged in the liquid ejection head substrate 21 in juxtaposition with respective liquid ejection ports 22 at positions that correspond to the respective liquid ejection ports 22. Note that the ink ejection ports 22 are arranged at the lower surface side of the actuators 10 (side shooter type), but the ink ejection ports 22 may alternatively be arranged at a lateral surface side of the respective actuators 10 (edge shooter type). Apertures (not illustrated) are formed at the top surface of the liquid ejection head substrate 21 at positions that correspond to the respective pressure chambers 23 and the actuators 10 are arranged so as to close the respective apertures. Each of the actuators 10 includes a vibrating plate 11 and a piezoelectric device 15, which piezoelectric device 15 by turn includes a piezoelectric thin film 12 and a pair of electrodes (including a lower electrode 13 and an upper electrode 14).

While the material of the vibrating plates 11 is not subjected to any particular limitations, it is preferably selected from semiconductors such as Si, metals, metal oxides and glass. The piezoelectric devices 15 and the vibrating plates 11 may be formed by way of bonding or adhesion. Each of the vibrating plates 11 may be used as substrate, and a lower electrode and a piezoelectric thin film may be formed directly on the substrate. Furthermore, the vibrating plates 11 may directly be formed on the liquid ejection head substrate 21.

3. Piezoelectric Thin Film Manufacturing Method

Now, the piezoelectric thin film manufacturing method of this embodiment will be described below. The manufacturing method of this embodiment includes a step of forming a coating layer, a step of forming a dried coating layer and a step of heating the dried coating layer. Each of the above-listed steps will be described below.

Note that, as far as this specification is concerned, the expression of "coating layer" refers to a layer formed by a coating solution applied to a substrate in a state where the organic solvent of the coating solution has not substantially evaporated yet. Also note that the expression of "dried coating layer" refers to a layer in a state where the organic solvent has substantially already evaporated.

(1) Step of Forming Coating Layer

In the step of forming a coating layer, a coating solution containing an organic solvent and a piezoelectric thin film precursor is applied onto a substrate. A substrate on which a coating layer containing an organic solvent and a piezoelectric thin film precursor is formed is prepared in this way. Examples of materials that can be used for the piezoelectric thin film precursor include hydrolizable compounds of each of the component metals, partially hydrolyzed compounds thereof, partial poly-condensated compounds thereof, pyrolizable compounds and starting materials of such compounds. Starting materials for producing such compounds include organic metal compounds. Typical examples of organic metal compounds include metal alkoxides, organic acid salts and metal complexes such as β-diketone complexes of the metals listed earlier. As for metal complexes, various other complexes such as amine complexes can also be utilized to produce metal complexes. Examples of β-diketones that can be used to form β-diketone complexes include acetylacetone (=2,4-pentanedione), (heptafluorobutanoyl) pivaloylmethane, dipivaloylmethane, trifluoroacetylacetone and benzoylacetone.

Specific examples of organic metal compounds that can be used as starting materials include lead compounds and lanthanum compounds such as acetates (lead acetate, lanthanum acetate) and other organic acid salts as well as lead diisopropoxide and other organic metal alkoxides. Preferable examples of titanium compounds include organic titanium alkoxides such as titanium tetraethoxide, titanium tetraisopropoxide, titanium tetra-n-butoxide, titanium tetraisobutoxide, titanium tetra-tert-butoxide and titanium dimethoxydiisopropoxide, although organic acid salts of titanium and organic titanium complexes can also be employed. The above description on titanium compounds is also applicable to zirconium compounds. Moreover, the above description on titanium compounds is also non-limitatively applicable to other metal compounds. Any of the above-listed metal compounds may be combined for use. As for organic metal compounds, complexed organic metal compounds containing two or more than two component metals may also be employed in addition to compounds containing only a single metal such as those described above.

The coating solution is prepared by dissolving or dispersing an organic metal compound as described above into an appropriate organic solvent. For example, the coating solution may be prepared so as to contain a complexed organic metal oxide (an oxide containing two or more than two metals) that is a piezoelectric thin film precursor.

The organic solvent to be used to prepare the coating solution may be selected from known various solvents by taking dispersability and applicability into consideration. Examples of organic solvents that can be used to prepare the coating solution include alcohol type solvents such as methanol, ethanol, n-butanol, n-propanol and isopropanol, ether type solvents such as tetrahydrofuran and 1,4-dioxane, cellosolve type solvents such as methyl cellosolve and ethyl cellosolve, amide type solvents such as N,N-dimethylformamide, N,N-dimethylacetamide and N-methylpyrrolidone, and nitlyl type solvents such as acetonitrile. Of the above-listed solvents, the use of an alcohol type solvent is preferable.

While the content ratio of the organic solvent in the coating solution is not subjected to any particular limitations, the volume of the organic solvent is preferably so regulated as to make the metal solid concentration of the coating solution is found to be not less than 15 mass % and not more than 30 mass %. When the content ratio of the solvent in the coating solution is within the above-defined range, the thickness of the piezoelectric thin film can easily be made to be not less than 150 nm and not more than 400 nm.

When a plurality of organic metal compounds are employed in the coating solution, the ratio of the organic metal compounds in the coating solution is preferably substantially the same as the composition ratio of the piezoelectric thin film to be manufactured, which may, for instance, be $Pb_{(1.00\sim1.20)}(Zr_xTi_{1-x})O_3$, (where x=0.4 to 0.6). Note that, when a piezoelectric thin film of $Pb_{(1.00\sim1.20)}(Zr_xTi_{1-x})O_3$, (where x=0.4 to 0.6), is to be formed, such a lead compound is generally highly volatile and there may be instances where lead is lost due to evaporation in the heat treatment step, which will be described later. Therefore, lead may well be supplied slightly in excess, for example, not less than 2 mol % and not more than 40 mol % relative to the quantity of lead that is required in terms of stoichiometric ratio in view of the expected loss. The extent to which lead is lost varies depending on the type of lead compound that is employed and/or the thin film forming conditions and can be determined by means of an experiment.

1,8-diazabicyclo[5.4.0]-7-undecene (which may also be expressed as "DBU" hereinafter), 1,5-diazabicyclo[4.3.0] non-5-ene (which may also be expressed as "DBN" hereinafter) and/or 1,4-diazabicyclo[2.2.2]octane (which may also be expressed as "DABCO" hereinafter) may be added to the coating solution as stabilizing agent. One or more than one conventional stabilizing agents selected from β-diketones (e.g., acetylacetone, (heptafluorobutanoyl)pivaloylmethane, dipivaloylmethane, trifluoroacetylacetone, benzoylacetone, etc.), keto acids (e.g., acetylacetic acid, propionylacetic acid, benzoylacetic acid, etc.), lower alkyl esters, which may typically be ethyl, propyl and butyl esters, of such keto acids as above-listed ones, oxy acids (e.g., lactic acid, glycolic acid, α-oxybutylic acid, salicylic acid, etc.), lower alkyl esters of such oxy acids as above-listed ones, oxyketones (e.g., diacetone alcohol, acetoin, etc.), α-amino acids (e.g., glycine, alanine, etc.), alkanol amines (e.g., diethanol amine, triethanol amine, monoethanol amine, etc.) and so on may also be used in combination with the stabilizing agents.

That content ratio of the stabilizing agent or agents is preferably not less than 0.05 and not more than 5, more preferably not less than 0.1 and not more than 1.5, relative to the mol ratio of all the metal atoms in the solution.

In the coating step, the coating solution is applied onto the electrode of a substrate having an electrode on the surface thereof. Known coating techniques such as spin coating, dip coating, bar coating and spray coating may selectively be used for applying the coating solution. When the coating solution is applied onto the substrate, the surface of the substrate onto which the coating solution is to be applied is preferably arranged in a horizontal direction (a direction orthogonal to the vertical direction). Such an arrangement can produce a coating layer having a uniform film thickness and a uniform distribution of the piezoelectric thin film precursor. The coating solution may be applied only once or a plurality of times.

The film thickness of a piezoelectric thin film (when the piezoelectric thin film manufacturing process is completed) that is obtained by applying the coating solution only once is preferably but not limitatively not less than 150 nm and not more than 400 nm. A piezoelectric thin film having excellent piezoelectric characteristics can be manufactured when a film thickness of not less than 150 nm is obtained for the piezoelectric thin film by a few times of application of the coating solution. Epitaxial crystal growth can effectively be realized in the film thickness direction when the piezoelectric thin film is made to represent a film thickness of not more than 400 nm.

The film thickness of a piezoelectric thin film can be controlled by making both the concentration of the piezoelectric thin film precursor in the coating solution and the conditions of application of the coating solution variable. The conditions of application of the coating solution can be determined by means of an experiment. For example, a coating solution representing a solid content concentration of not less than 20 mass % and not more than 25 mass % is applied by means of a spin coating technique of 2,000 rpm, the applied coating solution is dried and the piezoelectric thin film precursor is heat treated. Then, as a result, a piezoelectric thin film having a film thickness of not less than 200 nm and not more than 330 nm can be formed by each single application.

(2) Step of Forming Dried Coating Layer

In the step of forming a dried coating layer that is to be conducted after the step of forming a coating layer, the organic solvent is evaporated from the coating layer in a windless environment to obtain a dried coating layer that contains a piezoelectric thin film precursor. This step is conducted normally at a temperature not lower than 100° C. and not higher than 450° C. For this step, the substrate is put into a heat source, which may be a drier, a hot plate, a tubular furnace, an electric furnace or the like. Alternatively, the substrate may directly be brought into contact with a heat source, which may be a drier, a hot plate, a tubular furnace, an electric furnace or the like, for this step. Of the above-listed heat sources, a hot plate that can heat the substrate from the rear surface thereof is preferable from the viewpoint of producing a uniform heating temperature.

The step of forming a dried coating layer is conducted such that the surface of the substrate to which the coating solution has been applied (coated surface) is put into a windless environment. More specifically, the surface of the substrate to which the coating solution has been applied should not be exposed to an air supply port for supplying warm or hot air or to an exhaust port for expelling exhaust gas. When an air supply port and an exhaust port needs to be provided, care should be taken so as not to substantially give rise to a flow of the organic solvent and/or a hot air on the substrate. The expression of a "windless condition" as used for the purpose of the present invention includes a "substantially windless condition". A "substantially windless condition" refers to a condition where the velocity of air flow is not more than 0.05 m/sec between the surface of the substrate to which the coating solution has been applied and a position located 20 cm above the surface of the substrate within the upwardly projected area of the substrate.

The wind speed is determined by measuring the wind speed on the substrate by means of a commercially available anemometer.

As described above, the step of forming a dried coating layer is conducted in a substantially windless environment. Then, as a result, the ratio of the reflection intensity of (100) plane relative to the sum of the reflection intensities of (100) plane, (110) plane and (111) plane of the piezoelectric thin film (the ratio of the reflection intensity as measured by X-ray diffractometry) can be made to be not less than 95%. Additionally, a piezoelectric thin film of which the ratio of (100) plane represents unevenness only to a small extent can be obtained.

The mechanism of producing the above-described results can assumedly be explained by that, if air is supplied directly to the substrate and the vapor of the organic solvent is expelled directly from the substrate in the step of forming a dried coating layer, the residual organic groups remaining on the substrate after drying the coating solution that has been applied onto the substrate gets into an uneven in-surface state at the coated surface of the substrate. As the in-surface state of the residual organic groups at the coated surface is made variable, the in-surface stress in the subsequent heat treatment process supposedly becomes uneven and variable as a function of the in-surface position to by turn make the ratio of the reflection intensity of (100) plane variable in the material of the piezoelectric thin film. The expression of "the in-surface state of the organic groups at the coated surface is made variable" includes not only instances where the extent to which the organic groups remain varies as a function of the position in the in-surface direction of the coated surface but also instances where the extent to which organic groups remain varies as a function of the position of the distance from the substrate in the thickness direction of the coated surface, for example, between a position located close to the substrate and a position located remote from the substrate as viewed in the thickness direction. Furthermore, the expression of "the state of the residual organic groups" refers to all the possible states of the residual organic groups that influence the orientation of the piezoelectric thin film in the subsequent heat treatment process.

For the purpose of putting the applied coating solution in a substantially windless environment in the drying step, for instance, air is neither supplied nor expelled in the drying step when a hot plate is employed as heat source. When air is supplied and exhausted by way of an air supply port and an exhaust port respectively, shield plates are arranged respectively vis-à-vis the supply port and the exhaust port so that the air flow may not directly contact the coating solution on the substrate and the coated surface of the substrate may be held in a substantially windless environment. Furthermore, the vapor of the organic solvent that evaporates from the coating solution on the substrate is controlled so as to unforcedly move upward due to the convection produced by the heating by the hot plate. The expression of "shield plates are arranged respectively vis-à-vis the supply port and the exhaust port" refers to that shield plates are arranged respectively vis-à-vis the hole that operates as the inlet of the supply port and the hole that operates as the inlet of the exhaust port. While there are no particular limitations to the distance by which the vapor of the organic solvent unforcedly moves up, the distance is preferably not less than about 15 cm from the coated surface of the substrate. Furthermore, while the material of the shield plates is not subjected to any particular limitations, the shield plates preferably represent a mechanical strength of preventing the shield plates from being bent and/or damaged if they are hit by gas that is flowing at a predetermined velocity.

When there exists a gas flow due to an operation of supplying air and an operation of expelling exhaust gas, shield plates are preferably provided so as to be arranged substantially vertically, substantially horizontally or both substantially vertically and substantially horizontally relative to the surface of the substrate that is being coated. Essentially, there arises no problem so long as air is supplied and exhaust gas is expelled without blocking the vapor of the evaporating organic solvent that is unforcedly moving up.

Figure 2:
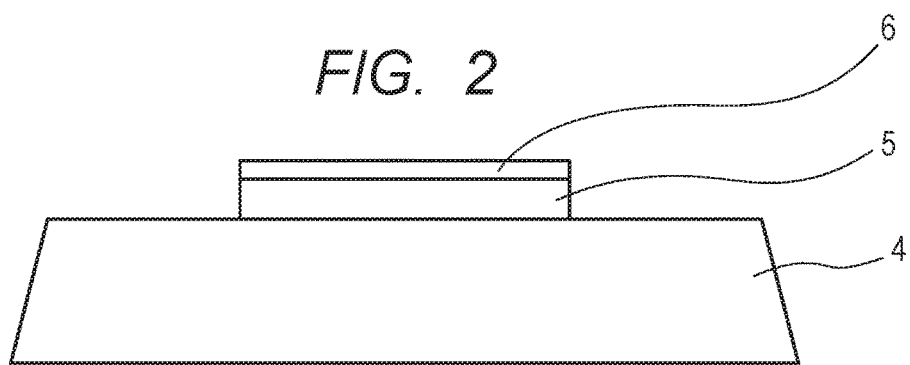
FIG. 2 is a schematic illustration of an embodiment of piezoelectric thin film manufacturing method according to the present invention.
Figure 3:
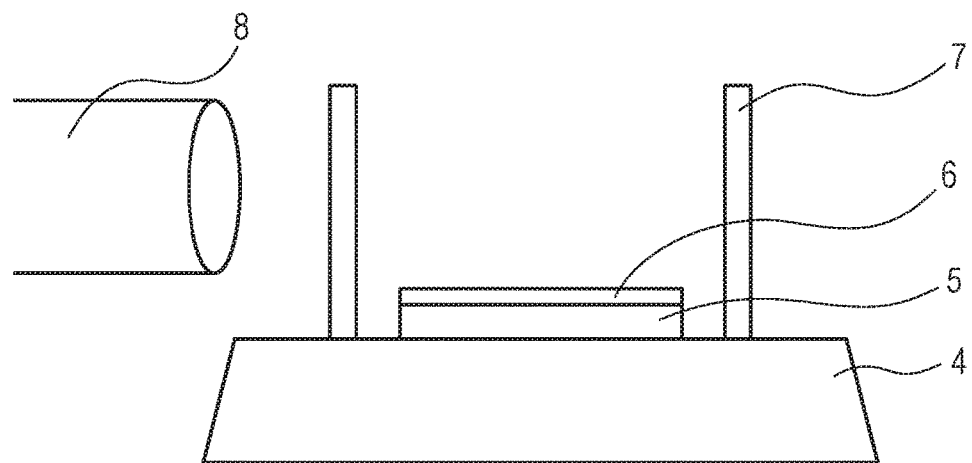
FIG. 3 is a schematic illustration of another embodiment of piezoelectric thin film manufacturing method according to the present invention.
Figure 4:
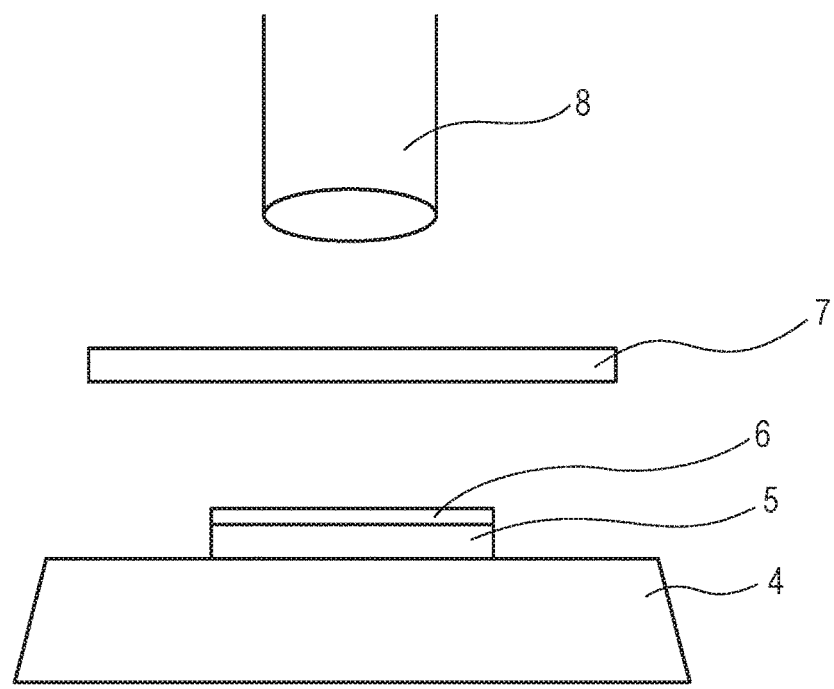
FIG. 4 is a schematic illustration of still another embodiment of piezoelectric thin film manufacturing method according to the present invention.

FIGS. 2, 3 and 4 are schematic illustrations of exemplar arrangements for the step of forming a dried coating layer of this embodiment when a hot plate is employed as heat source. In FIGS. 2, 3 and 4, 4 denotes a hot plate, 5 denotes a substrate, 6 denotes a coating solution applied onto the substrate, 7 denotes a shield plate, and 8 denotes an exhaust port. A hot plate 4 that can uniformly heat the entire surface of the substrate 5 needs to be used.

With the arrangement of FIG. 2, neither an air supply port nor an exhaust port is provided above the substrate 5 so that the vapor of the organic solvent that is evaporating from the coated surface of the substrate 5 unforcedly moves upward. This arrangement provides a substantially windless environment because no gas flow that is attributable to air supply and gas exhaustion takes place so that no shield plate 7 needs to be provided.

In FIGS. 3 and 4, an exhaust port 8 is arranged near the substrate. With these arrangements, the gas flow on and above the substrate 5 may influence the coated surface of the substrate 5. Therefore, a shield plate 7 needs to be arranged between the exhaust port 8 and the substrate 5 such that the shield plate 7 faces the exhaust port 8. FIG. 3 illustrates an instance where the exhaust port 8 extends in a horizontal direction that runs in parallel with the coated surface of the substrate 5. In such an instance, the shield plate 7 is arranged substantially vertically relative to the coated surface of the substrate 5 so as to surround the coated surface. In other words, the shield plate 7 is arranged around the substrate 5 so as to extend in a direction that intersects the substrate 5. FIG. 4 illustrates an instance where the exhaust port 8 extends in the direction that is vertical to the coated surface of the substrate 5. In such an instance, the shield plate 7 is arranged so as to extend substantially in horizontal directions and runs in parallel with the coated surface of the substrate 5.

Note, however, that the direction in which the shield plate 7 faces is not limited to the instances of FIGS. 3 and 4. For example, the shied plate 7 may be arranged so as to extend substantially in horizontal directions or in the vertical direction regardless of the direction in which the air supply port extends and the direction in which the exhaust port extends. Alternatively, the shield may be made to extend in a direction that is found between 0° and 180° relative to any horizontal direction, or a plurality of shield plates may be arranged in respective directions that differ from each other. In short, the shield plate 7 is only needs to be arranged so as to intersect a virtual line connecting the air supply port and the coated surface and/or a virtual line connecting the exhaust port and the coated surface.

The preferable temperature range of the hot plate 4 is between 100° C. and 450° C. The organic solvent in the coating solution applied onto the surface of the substrate can be dried in a short period of time when the temperature of the hot plate 4 is not lower than 100° C. On the other hand, no unevenness arises to the temperature of the hot plate 4 and the surface of the substrate 5 to which the coating solution has been applied can be uniformly heated when the temperature of the hot plate is not higher than 450° C. The coating solution applied to the surface of the substrate 4 may be heated stepwise at a plurality of different temperatures. For example, the coating solution may be dried by means of a hot plate firstly at a relatively low temperature (e.g., 150° C.) immediately after the application of the coating solution and subsequently dried by means of a hot plate at a relatively high temperature (e.g., 300° C.)

The duration of the drying step is generally between 1 minute and 10 minutes. Preferably, the coating solution is dried to such a state where, if the coated surface is touched by an object, the coating solution does not adhere to the object.

As for the in-surface uniformity of temperature at the substrate heated by the hot plate is not beyond ±3° C. from the predefined temperature. When the in-surface uniformity of temperature at the substrate heated by the hot plate is within ±3° C. of the predefined temperature, the organic solvent in the coating solution applied to the substrate evaporates at a uniform evaporation rate regardless of the position in the substrate so that the ratio of (100) orientation of the piezoelectric thin film in the substrate can be made to be hardly variable.

(3) Step of Heating the Dried Coating Layer

After forming a dried coating layer as described above, a heating step of further heating the dried coating layer is conducted. In this heating step, the dried coating layer is heated to produce a piezoelectric thin film from the piezoelectric thin film precursor contained in the dried coating layer. In this step, the substrate is put into a heat source, which may be a drier, a hot plate, a tubular furnace, an electric furnace or the like. Alternatively, this step may be conducted by directly bringing the substrate into contact with any of such the heat sources. The heating temperature of this heating step is preferably not lower than 500° C. and not higher than 800° C. The step of heating the dried coating layer may be realized by a plurality of heating operations or by a single heating operation. Preferably, the coating solution is heated for calcination and baked further at a temperature not lower than the crystallization temperature of the piezoelectric thin film precursor to crystalize the piezoelectric thin film precursor and produce a piezoelectric thin film.

The total film thickness of the piezoelectric thin film is preferably not less than 1,000 nm and not more than 4,000 nm. To obtain a piezoelectric thin film having such a total film thickness, the step of forming a coating layer, the step of forming a dried coating layer, and the step of heating the dried coating layer are preferably repeated for not less than three times and not more than 10 times. Then, the final heating step is preferably conducted at a temperature not lower than 600° C. and not higher than 800° C.

4. Piezoelectric Thin Film Manufacturing Apparatus

A piezoelectric thin film manufacturing apparatus includes a coating means, a drying means, and a heating means. The coating means can apply a coating solution containing an organic solvent and a piezoelectric thin film precursor onto a substrate to form a coating layer. The substrate is mounted on a mount section. The drying means can evaporate the organic solvent from the coating layer in a substantially windless environment to obtain a dried coating layer that contains the piezoelectric thin film precursor. The heating means can heat the dried coating layer and produce a piezoelectric thin film out of the piezoelectric thin film precursor contained in the dried coating layer.

EXAMPLES

Now, the present invention will be described more specifically by way of examples. However, the examples described below by no means limit the scope of the present invention.

(Preparation of Coating Solution)

As the coating solution for forming a piezoelectric thin film, a coating solution whose metal composition is expressed as Pb/Zr/Ti=1.2/0.52/0.48 was prepared in a manner as described below.

1.2 mol of a hydrate of lead acetate was heated for dehydration and 1.2 mol of 1,8-dizabicyclo[5.4.0]-7-undecene and 1-methoxy-2-propanol (9 mol) were added as stabilizing agent. The mixture was heated and agitated to make the components react with each other. Subsequently, 0.52 mol of tetra-n-butoxy zirconium and 0.48 mol of titanium tetraisopropoxide were added to the reaction product and the mixture was heated to make the components react with each other and the metal compounds become mutually complexed. Then, water (5 mol) and ethanol (5.0 mol) were added to cause a hydrolysis reaction to take place and obtain a piezoelectric thin film precursor containing metal oxides. At this time, acetic acid (3.8 mol) and acetylacetone (0.6 mol) were added. Thereafter, the solvent whose boiling point is not lower than 100° C. was completely removed by means of a rotary evaporator and diethyleneglycolmonoethylether (organic solvent) was added to regulate the concentration of the metal oxides to 23 mass % as reduced to the above composition formula. Thus, the coating solution was prepared by way of the above-described process.

Example 1

A layer of silica ($SiO_2$) was formed to a thickness of 500 nm on the surface of a silicon substrate having a diameter of 6 inches (15 cm) by means of thermal oxidation and then Ti and Pt were deposited thereon to respective thicknesses of 50 nm and 200 nm to produce a substrate to be used in this example.

The coating solution prepared in the above-described manner was applied to the Pt surface of the substrate by means of a spin coater (3,000 rpm, 15 seconds) as the first layer (the step of forming a coating layer). Then, a hot plate (Shamal hot plate HHP-411: trade name, available from AS ONE Corporation) was brought in. The hot plate had been heated to 280° C. and showed a plate surface temperature unevenness of 280° C.±1° C.). The substrate, onto the surface of which the coating solution had already been applied, was placed on the hot plate for 5 minutes to evaporate the organic solvent in the applied coating solution (the step of forming a dried coating layer). At this time, the hot plate was arranged in a substantially windless environment (wind speed 0 m/s) (measured at a position 2 cm above the substrate; anemometer: DT-8880, available from CEM Corporation). No shield plate was used.

The substrate from which the organic solvent had been evaporated was put into an electric furnace, which was held to 650° C., for 10 minutes for calcination. The prepared coating solution was applied to the calcined substrate as in the case of forming the first layer and the organic solvent was evaporated in the conditions same as the conditions for evaporating the first layer. Furthermore, the second-layer-carrying substrate was put into the electric furnace that was held to 650° C. for 10 minutes for calcination as in the case of the first layer. The step of applying the coating solution, the step of drying the applied coating solution on the hot plate and the calcination step as described above were repeated six times more to produce a total of eight layers of the coating solution. After forming a film of eight layers, the substrate was put into the electric furnace that was held at 700° C. for 20 minutes to turn the piezoelectric thin film precursor into a piezoelectric thin film of $Pb_{1.2}(Zr_{0.52}Ti_{0.48})O_3$. Note that the calcination step and the 20 minutes heat treatment step conducted in the electric furnace held at 700° C. as described above correspond to the step of heating the applied coating layer.

Example 2

In Example 2, the hot plate employed in Example 1 was placed in a clean bench for industrial use (Clean Bench PCV-1303BE: trade name, available from HITACHI). As for exhaustion, the exhaust gas was expelled at a wind speed of 5.0 m/s using only the front side of the clean bench table surface as exhaustion surface. Additionally, a 25 cm high solid metal fence panel was arranged around the hot plate (and made open at the top) to prevent exhaust gas wind from directly flowing into the inside of the fence panel to a height of about 15 cm from the hot plate surface. At this time, the wind speed was 0 m/s within the fence plate up to about 15 cm from the hot plate surface (as measured with an arrangement same as that of Example 1 for measuring the wind speed). A piezoelectric thin film was formed by way of steps same as those of Example 1, using a substrate and a coating solution that were the same as their counterparts of Example 1 except that the hot plate was arranged in the above-described manner).

Example 3

In Example 3, the hot plate employed in Example 1 was placed in a clean bench for industrial use (Clean Bench PCV-1303BE: trade name, available from HITACHI). As for exhaustion, the exhaust gas was expelled at a wind speed of 5.0 m/s using only the front side of the clean bench table surface as exhaustion surface. Additionally, a 30 cm high solid metal fence panel was arranged around the hot plate (and made open at the top) to prevent exhaust gas wind from flowing into the inside of the fence panel to a height of about 20 cm from the hot plate surface. At this time, the wind speed was 0 m/s within the fence plate up to about 20 cm from the hot plate surface (as measured with an arrangement same as that of Example 1 for measuring the wind speed). A piezoelectric thin film was formed by way of steps same as those of Example 1, using a substrate and a coating solution that were the same as their counterparts of Example 1 except that the hot plate was arranged in the above-described manner.

Example 4

In Example 4, the hot plate employed in Example 1 was heated to a temperature of 150° C. A substrate to which the coating solution had been applied was placed on the hot plate for 5 minutes to evaporate the organic solvent in the coating solution (the step of forming a dried coating layer). At this time, the entire substrate was covered by a meshed-screen-like stainless steel cover having a plurality of 3 mm-diameter holes (24-cm wide, 19-cm deep, 3-cm high). A piezoelectric thin film was formed by way of steps same as those of Example 1, using a substrate and a coating solution that were the same as their counterparts of Example 1 except that the hot plate was arranged in the above-described manner.

Example 5

In Example 5, the hot plate employed in Example 2 was heated to a temperature of 150° C. An aluminum-made lid having a 10 mm-diameter hole at the center of the hot plate was placed at the top of the 25 cm-high metal fence panel. At this time, the wind speed was 0 m/s within the fence plate up to about 20 cm from the hot plate surface (as measured with an arrangement same as that of Example 1 for measuring the wind speed). A piezoelectric thin film was formed by way of steps same as those of Example 1, using a substrate and a coating solution that were the same as their counterparts of Example 1 except that the hot plate was arranged in the above-described manner.

Comparative Example 1

A piezoelectric thin film was formed by using a substrate and a coating solution same as their counterparts of Example 1 and the steps same as those of Example 1 but the 25 cm-high fence panel arranged around the hot plate in Example 2 was not employed in this comparative example. A wind speed of not less than 0.1 m/s and not more than 0.2 m/s was observed at a position 1 cm above the top surface of the substrate.

Figure 5:
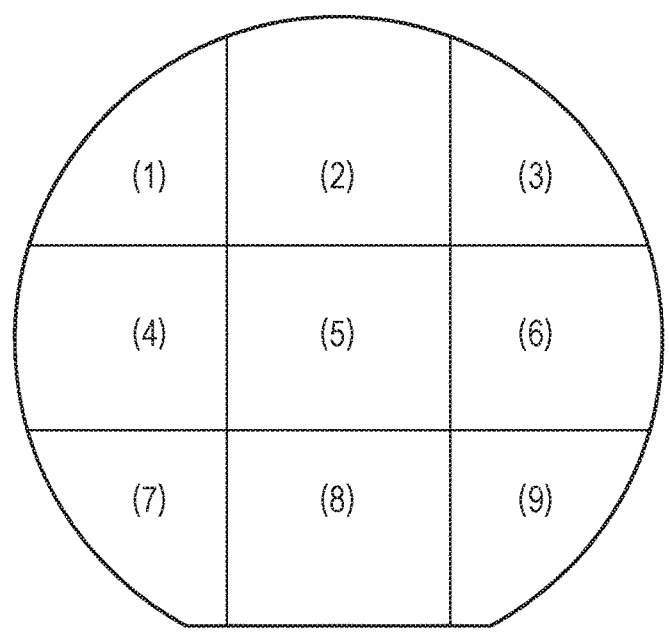
FIG. 5 is a schematic illustration of the X-ray diffraction measurement positions on the substrates of Examples and Comparative Example.

Each of the piezoelectric thin films formed on the silicon substrates of the above-described examples and comparative example was evaluated in a manner as described below. Each of the silicon substrates carrying a piezoelectric thin film and prepared in the above-described manner was divided into nine pieces as illustrated in FIG. 5 and the X-ray diffraction (2θ/θ method) of the piezoelectric thin films of each of the pieces was measured by means of an X-ray diffraction instrument (RINT2100: trade name, available from Rigaku). Referring to FIG. 5, the piece (5) was measured for X-ray diffraction at the part thereof from the center of the substrate to the 3 cm-radius circle drawn on the piece and each of the pieces (1), (2), (3), (4), (6), (7), (8) and (9) were measured for X-ray diffraction at the part thereof between the 3 cm-radius circle and the 6 cm-radius circle drawn on the piece. FIG. 6 represents the X-ray diffraction pattern of the piece (5) of Example 1. The peak observed near 40° is the peak of (111) plane of Pt arranged on the substrate.

From FIG. 6, the reflection intensity of (100) plane of each of the piezoelectric thin films was divided by the sum of the reflection intensities of (100) plane, (110) plane, and (111) plane to determine the ratio of the reflection intensity of (100) plane. Since the peak of (200) plane observed near 44° is crystal plane equivalent to that of (100) plane, it is not included in the ratio of the intensity of (100) plane. Table 1 below represents the intensity ratio of (100) plane at the positions of (1) through (9) of each of Examples 1, 2, 3 and Comparative Example 1.

TABLE 1

|  | Example 1 (%) | Example 2 (%) | Example 3 (%) | Example 4 (%) | Example 5 (%) | Comp. Ex 1 (%) |
| --- | --- | --- | --- | --- | --- | --- |
| (1) | 97.0 | 96.4 | 95.3 | 96.4 | 96.4 | 55.2 |
| (2) | 98.2 | 97.2 | 96.4 | 97.2 | 97.7 | 64.7 |
| (3) | 98.1 | 97.6 | 97.3 | 95.7 | 97.9 | 33.6 |
| (4) | 97.7 | 97.6 | 95.9 | 97.5 | 96.8 | 18.6 |
| (5) | 97.9 | 97.5 | 97.1 | 98.2 | 97.6 | 42.0 |
| (6) | 98.1 | 97.8 | 97.9 | 97.4 | 98.0 | 38.8 |
| (7) | 96.8 | 96.6 | 95.5 | 97.7 | 97.0 | 58.9 |
| (8) | 97.5 | 97.0 | 96.2 | 97.9 | 98.1 | 45.7 |
| (9) | 98.0 | 97.4 | 97.4 | 95.4 | 97.8 | 42.5 |

From Table 1, the ratio of the orientation of (100) plane of each of the piezoelectric thin films of Examples 1 through 5 is as high as not less than 95% all the way from the center to the outer peripheral part of the substrate. On the other hand, the ratio of the orientation of (100) plane of the piezoelectric thin film of Comparative Example 1 is low to indicate a high degree of unevenness between the center part and the outer peripheral part of the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A piezoelectric thin film containing $Pb_{(1.00\sim1.20)}(Zr_xTi_{1-x})O_3$, where x=0.4 to 0.6, and having crystal orientations of at least a (100) plane, a (110) plane, and a (111) plane,
    wherein a ratio of a reflection intensity of the (100) plane relative to a sum of reflection intensities of the (100) plane, the (110) plane, and the (111) plane of the $Pb_{(1.00\sim1.20)}(Zr_xTi_{1-x})O_3$, where x=0.4 to 0.6, is not less than 95% as measured by X-ray diffractometry, and
    wherein the piezoelectric thin film is formed after a dried coating layer is formed by applying a coating solution onto a substrate and heating the substrate to evaporate an organic solvent from the coating solution applied thereon in a state that a shield plate is arranged around the substrate.

2. A liquid ejection head comprising:
    an ink ejection port;
    a pressure chamber communicating with the ink ejection port;
    an actuator for causing a capacity of the pressure chamber to change in order to eject ink from the ink ejection port,
    wherein the actuator has a vibrating plate, a lower electrode, a piezoelectric thin film, and an upper electrode arranged in this order as viewed from the pressure chamber,
    wherein the piezoelectric thin film contains $Pb_{(1.00\sim1.20)}(Zr_xTi_{1-x})O_3$, where x=0.4 to 0.6, and has crystal orientations of at least a (100) plane, a (110) plane, and a (111) plane, wherein a ratio of a reflection intensity of the (100) plane relative to a sum of reflection intensities of the (100) plane, the (110) plane, and the (111) plane of the $Pb_{(1.00 \sim 1.20)}(Zr_xTi_{1-x})O_3$, where $x=0.4$ to $0.6$, is not less than 95% as measured by X-ray diffractometry, and
wherein the piezoelectric thin film is formed after a dried coating layer is formed by applying a coating solution onto a substrate and heating the substrate to evaporate an organic solvent from the coating solution applied thereon in a state that a shield plate is arranged around the substrate.

* * * * *